US008374040B2

(12) United States Patent
Bivens et al.

(10) Patent No.: US 8,374,040 B2
(45) Date of Patent: Feb. 12, 2013

(54) WRITE BANDWIDTH IN A MEMORY CHARACTERIZED BY A VARIABLE WRITE TIME

(75) Inventors: John A. Bivens, Ossining, NY (US); Michele M. Franceschini, White Plains, NY (US); Luis A. Lastras-Montano, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 167 days.

(21) Appl. No.: 13/034,936

(22) Filed: Feb. 25, 2011

(65) Prior Publication Data
US 2012/0218814 A1 Aug. 30, 2012

(51) Int. Cl.
*G11C 7/00* (2006.01)

(52) U.S. Cl. ............... 365/189.16; 365/163; 365/189.02; 365/189.05

(58) Field of Classification Search .................. 365/163, 365/189.02, 189.05, 189.16
See application file for complete search history.

(56) References Cited

U.S. PATENT DOCUMENTS

| | | | |
|---|---|---|---|
| 5,436,913 A | 7/1995 | Yamamura et al. | |
| 5,559,988 A | 9/1996 | Durante et al. | |
| 5,708,605 A | 1/1998 | Sato | |
| 5,742,787 A | 4/1998 | Talreja | |
| 5,940,861 A | 8/1999 | Brown et al. | |
| 6,006,339 A | 12/1999 | McClure | |
| 7,349,245 B2 | 3/2008 | Kim et al. | |
| 7,426,138 B1 | 9/2008 | Wong | |
| 2002/0145913 A1* | 10/2002 | Tanaka et al. | 365/185.22 |
| 2004/0136258 A1 | 7/2004 | Ishikawa | |
| 2005/0268207 A1 | 12/2005 | Gallagher et al. | |
| 2006/0181953 A1 | 8/2006 | Rotenberg et al. | |
| 2008/0189452 A1 | 8/2008 | Merry et al. | |
| 2009/0064129 A1 | 3/2009 | Chen et al. | |
| 2009/0067241 A1 | 3/2009 | Gorobets et al. | |
| 2009/0070521 A1 | 3/2009 | Gorobets et al. | |
| 2009/0070529 A1 | 3/2009 | Mee et al. | |
| 2009/0070748 A1 | 3/2009 | Lin et al. | |
| 2009/0303785 A1 | 12/2009 | Hwang et al. | |

FOREIGN PATENT DOCUMENTS
EP 0376285 B1 7/1990

OTHER PUBLICATIONS

International Search Report for PCT/US2012/022823 dated May 11, 2012.
Written Opinion for PCT/US2012/022823 dated May 11, 2012.

* cited by examiner

*Primary Examiner* — Hoai V Ho
*Assistant Examiner* — Pablo Huerta
(74) *Attorney, Agent, or Firm* — Cantor Colburn LLP; Dwayne Nelson

(57) ABSTRACT

A memory system that includes a plurality of memory arrays having memory cells characterized by a variable write time. The memory system also includes a memory bus configured to receive write commands, and a plurality of data buffers configured to communicate with the memory arrays. The memory system further includes an address buffer configured to communicate with the memory arrays to store the write addresses. A mechanism configured to receive a write command and to split a data line received with the write command into a number of parts is also included in the memory system. The parts of the data line are stored in different data buffers and the writing of the parts of the data line to memory arrays at the write address is initiated. The write command is completed when write completion signals specifying the write address have been received from all of the memory arrays.

24 Claims, 8 Drawing Sheets

WRITE BANDWIDTH IN A MEMORY CHARACTERIZED BY A VARIABLE WRITE TIME

BACKGROUND

The present invention relates generally to computer memory, and more specifically, to improving the write bandwidth in a memory characterized by a variable write time.

Conventional memories such as dynamic random access memory (DRAM) and static RAM (SRAM) are characterized by a deterministic time required to perform standard operations such as a write or a read. This influences the design of the memory system, in that, knowing the sequence of write and read accesses to the memory is sufficient to knowing when each access will be completed. There are however, various possible causes of variability in the write time of a memory technology or system. For example, a phase change memory (PCM) device capable of storing multiple bits per memory cell uses iterative write techniques, which may or may not succeed and for which the time required to succeed is non-deterministic. Iterative write techniques (commonly referred to as "write-and-verify") are used with PCMs in order to allow a controller for the memory to store a desired value with an increased accuracy, since the read operations offer a feedback mechanism that can be used to reduce errors in the writing process. Storage devices where iterative write techniques are utilized are often characterized by variable write times because the number of iterations required to perform a write may vary between memory cells. This variable nature of the write mechanism has an impact on write bandwidth if a conventional implementation designed for deterministic memories is used for the memory system.

Another example where the time to perform a write may vary between memory cells is in the case of a memory system where the maximum total power is bounded and there are several independent memory sub-arrays. In this case, each sub-array may take an unpredictable amount of time to write because it may not be allowed to write until the power budget occupation allows it.

BRIEF SUMMARY

An embodiment is a memory system that includes a plurality of memory arrays having memory cells that are characterized by a variable write time. The memory system also includes a memory bus configured to receive write commands that include write addresses and data lines. The memory system further includes a plurality of data buffers configured to communicate with the memory arrays, each data buffer associated with one of the memory arrays. The memory system further includes an address buffer configured to communicate with the memory arrays and to store the write addresses. The address buffer includes a plurality of dedicated address buffers, each dedicated address buffer associated with one of the memory arrays. The memory system further includes a mechanism configured to receive a write command from the memory bus, the write command including a write address and a data line. The mechanism is also configured to split the data line into a number of parts, to store parts of the data line in different data buffers, to store the write address in the address buffer, and to initiate writing the parts of the data line to memory arrays at the write address. The memory system further includes a write completion signal configured to communicate with the memory arrays for receiving write completion signals from the memory arrays. A write completion signal is generated by a memory array in response to the memory array completing a write of a part of the data line to the write address. The write command is completed when the write completion signals specifying the write address have been received from all of the memory arrays.

Another embodiment is a memory device that includes a memory array having a plurality of memory cells grouped into memory sub-arrays, the memory cells characterized by a variable write time. The memory device also includes a plurality of write heads configured to write to the memory cells, where the number of write heads is less than the number of memory cells in a memory sub-array. The memory device also includes programmable interconnection circuitry configured to connect the write heads to selected memory cells. The memory device further includes a mechanism configured to receive a write command, the write command including an address identifying a memory sub-array and a data line that includes bits. The mechanism is also configured to connect the write heads to a subset of the memory cells in the memory sub-array, to initiate a write by the write heads of a subset of the bits in the data line to the subset of the memory cells in the memory sub-array, to reconnect a write head to an other memory cell in the memory sub-array in response to the write head completing the write, and to initiate a write by the write head of a bit in the data line to the other memory cell in response to the reconnecting. The received write command is complete when all of the bits in the data line have been written.

A further embodiment is a computer implemented method for writing to memory. The method includes receiving a write command, the write command including an address identifying a memory sub-array and a data line that includes bits. The write command is received at a memory device that includes a memory array. The memory array includes a plurality of memory cells grouped into memory sub-arrays, the memory cells characterized by a variable write time. The memory device also includes a plurality of write heads for writing to the memory cells, where the number of write heads less than the number of memory cells in a memory sub-array. The write heads are connected to a subset of the memory cells in the memory sub-array. A write by the write heads of a subset of the bits in the data line to the subset of the memory cells in the memory sub-array is initiated. A write head is connected to an other memory cell in the memory sub-array in response to the write head completing the write. A write by the write head of a bit in the data line to the other memory cell is initiated in response to the reconnecting. The received write command is complete when all of the bits in the data line have been written.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

An embodiment provides an improved write bandwidth in a memory characterized by having a time to write into a memory location that is variable and/or non-deterministic. Embodiments described herein are applicable to any situation where an internal or external phenomenon can cause a write operation to vary between memory cells or to take a time different from what is expected.

In an embodiment, each data line to be written is split into pieces to be written into one or more memory arrays and a separate write buffer is associated with each memory array. In addition, an internal structure for the memory array is described herein that provides an improvement to the write performance of the memory in the presence of variable writing time and limited write circuitry resources.

As used herein the term "memory cell" refers to a physical entity that stores information and also provides for means of accessing this information. In an exemplary embodiment, where the memory devices are phase change memories (PCMs), a memory cell is comprised of a material that can change its physical state from amorphous to crystalline and vice versa by the application of suitable electrical signals. Also included in the cell is an access device such as, but not limited to, a diode or a transistor which is the means for stimulating electrically the material for write and read operations. As used herein, the term "memory location" may be interchanged with the term "memory cell". As used herein the term "memory array" or "array" refers to a collection (or group) of memory cells that can be read or written to independently of other arrays. In a memory array, the memory cells are organized in bitlines and wordlines, with memory cells located at the intersection of each bitline with each wordline.

In an embodiment, the memory devices are dynamic random access memory (DRAM) devices. In an additional embodiment, the memory devices are resistive RAM devices.

In another embodiment, the memory devices are PCM devices that include a mechanism (e.g., circuitry) capable of applying an iterative write technique known in the art. One technique that may be utilized includes accepting contents to be written into specified PCM cells, obtaining the contents to be written to each of the specified PCM cells, and one or more repetitions of the following steps: apply a programming pulse; read the contents of the PCM cell; and determine if the contents of the PCM cells meet a pre-specified stopping criterion. An example of a pre-specified stopping criterion is one that prescribes that the obtained PCM cell resistance lie within a given precision window from the resistance value representing the specified content.

Figure 1:
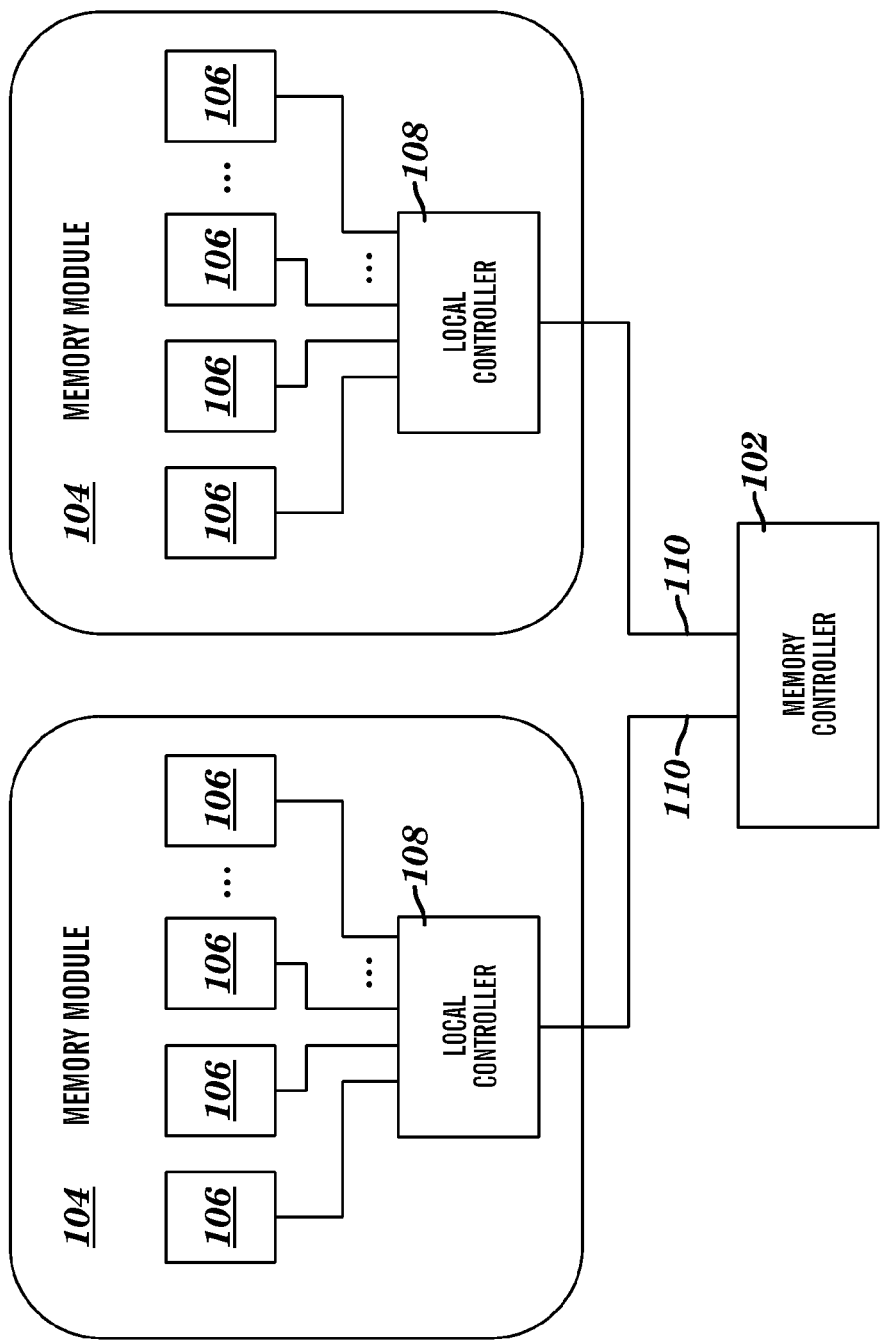
FIG. 1 is a block diagram of a memory system that includes memory modules in accordance with an embodiment.

FIG. 1 illustrates a block diagram of a memory system in accordance with an embodiment. The memory system illustrated in FIG. 1 includes a memory controller 102 that is connected to a number of memory modules 104 (in this example two) via a memory bus 110. Each memory module 104 includes several memory devices 106 (e.g., PCM devices, DRAM devices) and a local controller 108 for distributing and controlling the input/output (I/O) data flow to and from the memory devices 106.

Figure 2:
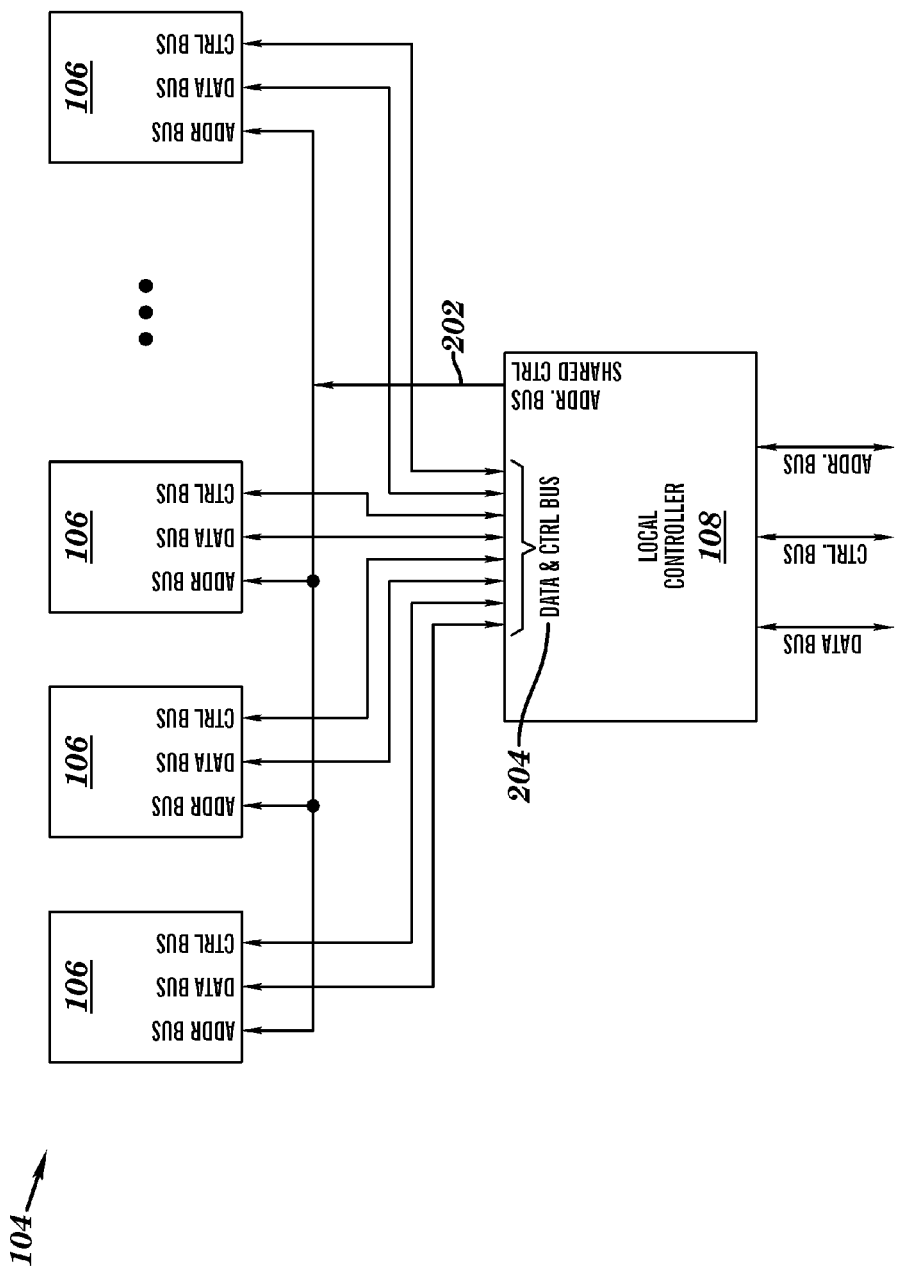
FIG. 2 is a block diagram of the memory module of FIG. 1 in accordance with an embodiment.

FIG. 2 illustrates a block diagram of the memory module 104 of FIG. 1 in accordance with an embodiment. The memory module 104 shows the local controller 108 in communication with the memory devices 106 through a common address bus and a shared control bus 202. In addition local controller 108 is in communication with each of the memory devices 106 via dedicated data and control buses 204.

Figure 3:
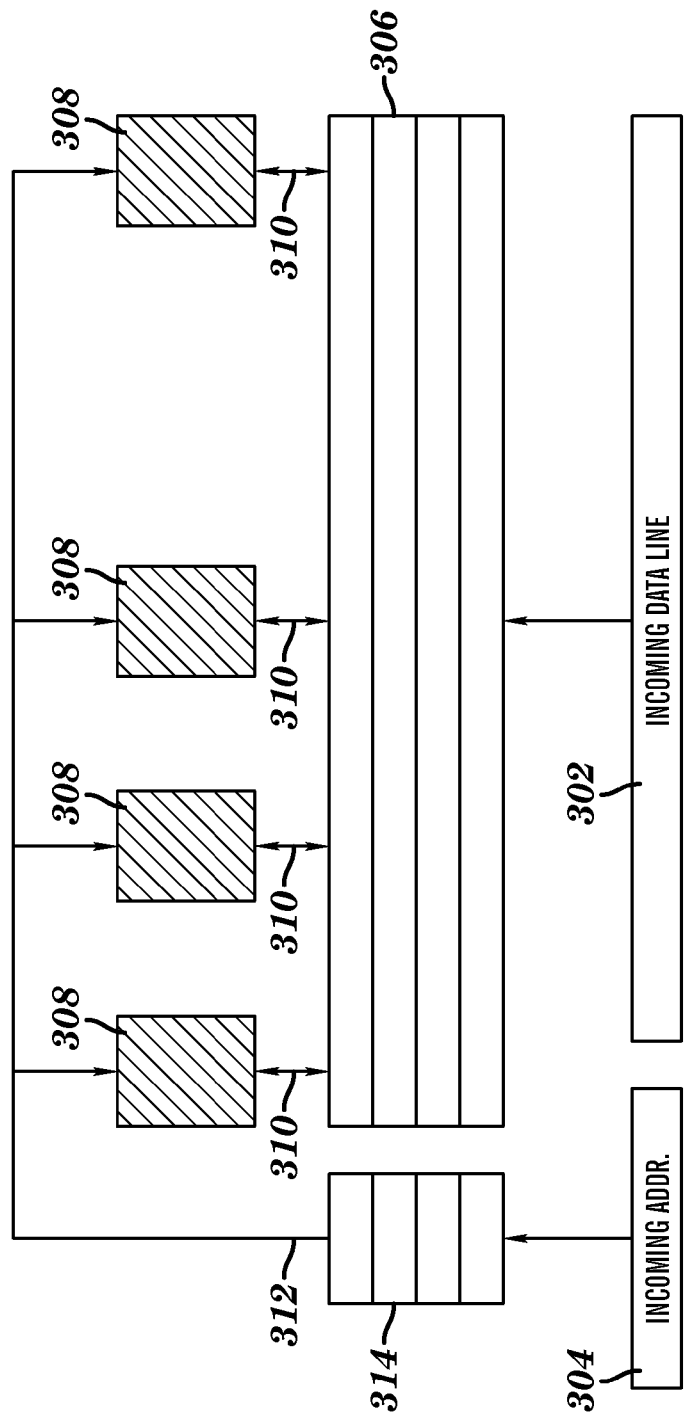
FIG. 3 is a block diagram of a contemporary memory system that utilizes data buffers.

FIG. 3 is a block diagram of a contemporary memory system that utilizes buffers. As shown in FIG. 3, an incoming data line 302, to be written into a specified incoming address 304, is received and queued in a data buffer 306. The data buffer 306 is connected to memory arrays 308 through a series of dedicated buses 310. Also as shown in FIG. 3, the incoming address 304 is queued into an address buffer 314 that is synchronized with the data buffer 306. An address from the address buffer 314 is sent to the memory arrays 308 via a shared address bus 312. A drawback to the structure depicted in FIG. 3 is that a write of the incoming data line 302 to the memory arrays 308 at the corresponding incoming address 304 is waits until each the memory arrays 308 have completed writing. In memory systems where the write times vary between cells, the speed of writing the data line (and also the bandwidth) is limited by the write speed of the memory cell that takes the longest time to write.

Figure 4:
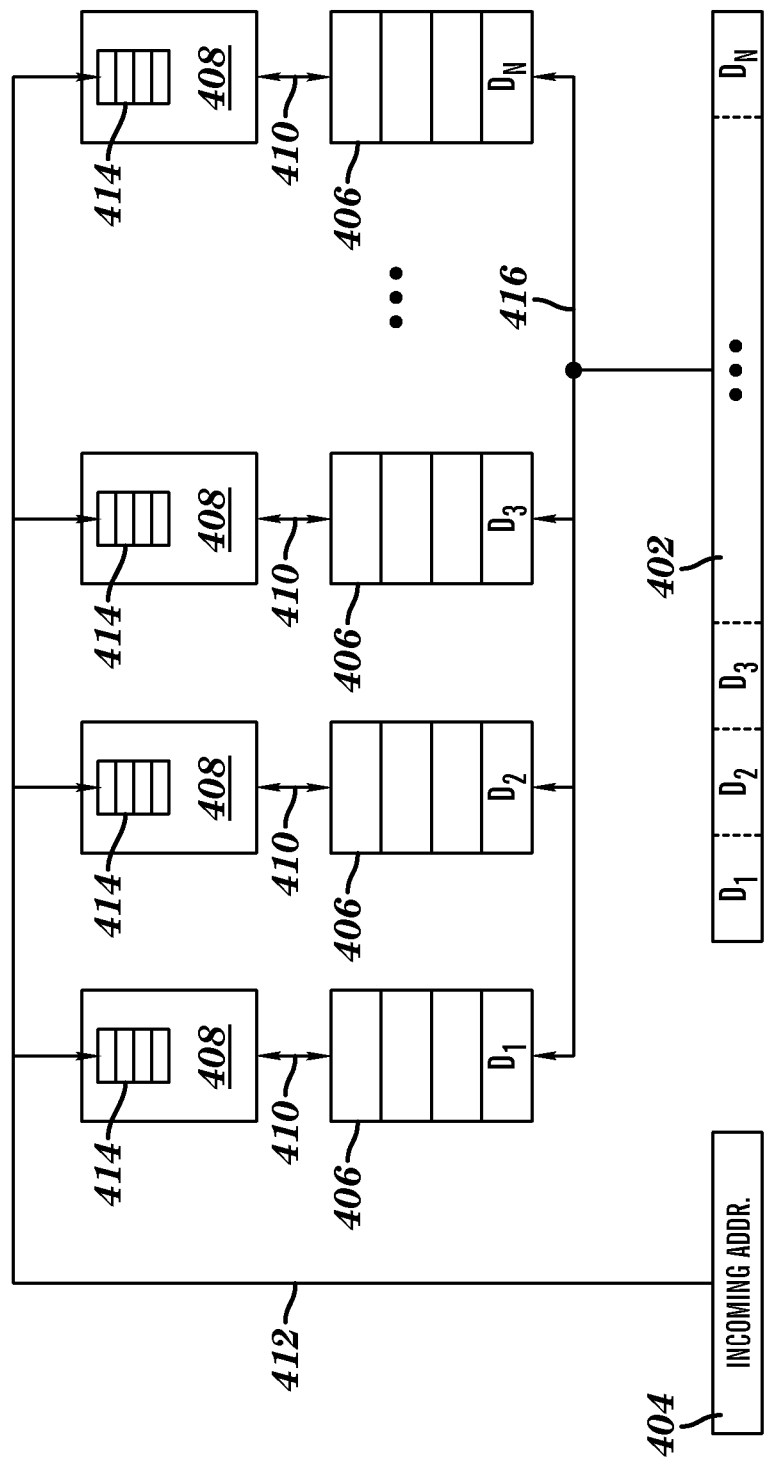
FIG. 4 is a block diagram of a memory system that utilizes separate data buffers for each memory array in accordance with an embodiment.

FIG. 4 is a block diagram of a memory system that utilizes separate data buffers 406 for each memory array 408 in accordance with an embodiment. As shown in FIG. 4, a separate data bus 416 is in communication with each memory array 408. An incoming data line 402, to be written into a specified incoming address 404, is received and split into several pieces (D1, D2, ... DN). Each piece of the incoming data line 402 is queued in one of the data buffers 406. The data buffers 406 are connected to corresponding memory arrays 408 through a series of dedicated buses 410. In an embodiment, the data buffers 406 are located on the local controller 108, the memory controller 102, or a host computer.

In an embodiment, the incoming data line is 512 bytes (Bs) and there are 16 memory arrays 408 (e.g., 16 memory devices 106). In this embodiment, 32 Bs (or 256 bits) are written to each memory array 408 during each write operation. Thus, each data buffer stores 256 bits of data per buffer row. In a memory device that stores 4 bits per memory cell, 64 memory locations are written in each write operation. This group of 64 memory locations that are written as a unit may be referred to as a memory bank. In an embodiment, where each memory bank has 8 write heads, it will require 8 cycles of 8-wide writes to write the 64 memory locations. Each write cycle may take a variable amount of time depending on the applied write technique applied to each memory cell. Embodiments can be tailored to support a wide variety of memory configurations with different data line sizes, different numbers of memory arrays, different numbers of write heads, etc.

As shown in FIG. 4, the incoming address 404 is received and queued into a separate address buffer 414 for each piece of the incoming data line 402, with each address buffer 414 being synchronized with the corresponding data buffer 406 for the memory array 408. The incoming address is sent to the memory arrays 408 through a shared address bus 412. In the embodiment depicted in FIG. 4, when a memory array 408 finishes a given write, it sends an acknowledge signal back using the dedicated buses 410. The corresponding data buffer 406 receives the acknowledge signal, and the corresponding entry is deleted from the data buffer 406. Similarly, when the memory array 408 finishes a given write, the corresponding address is deleted from the address buffer 414. Whenever each of the data buffers 406 has at least one empty location, a new incoming data line 402 is accepted into all the data buffers 406 and the corresponding address is broadcast on the shared address bus 412.

In another embodiment, all or a portion of the address buffers 414 are not located in the memory arrays 408, but instead are located on the local controller 108, the memory controller 102, or the host computer. In another embodiment, all or a portion of the data buffers 406 are located internal to the memory arrays 408.

In an embodiment each of the memory arrays 408 are located on different memory devices 106.

Figure 5:
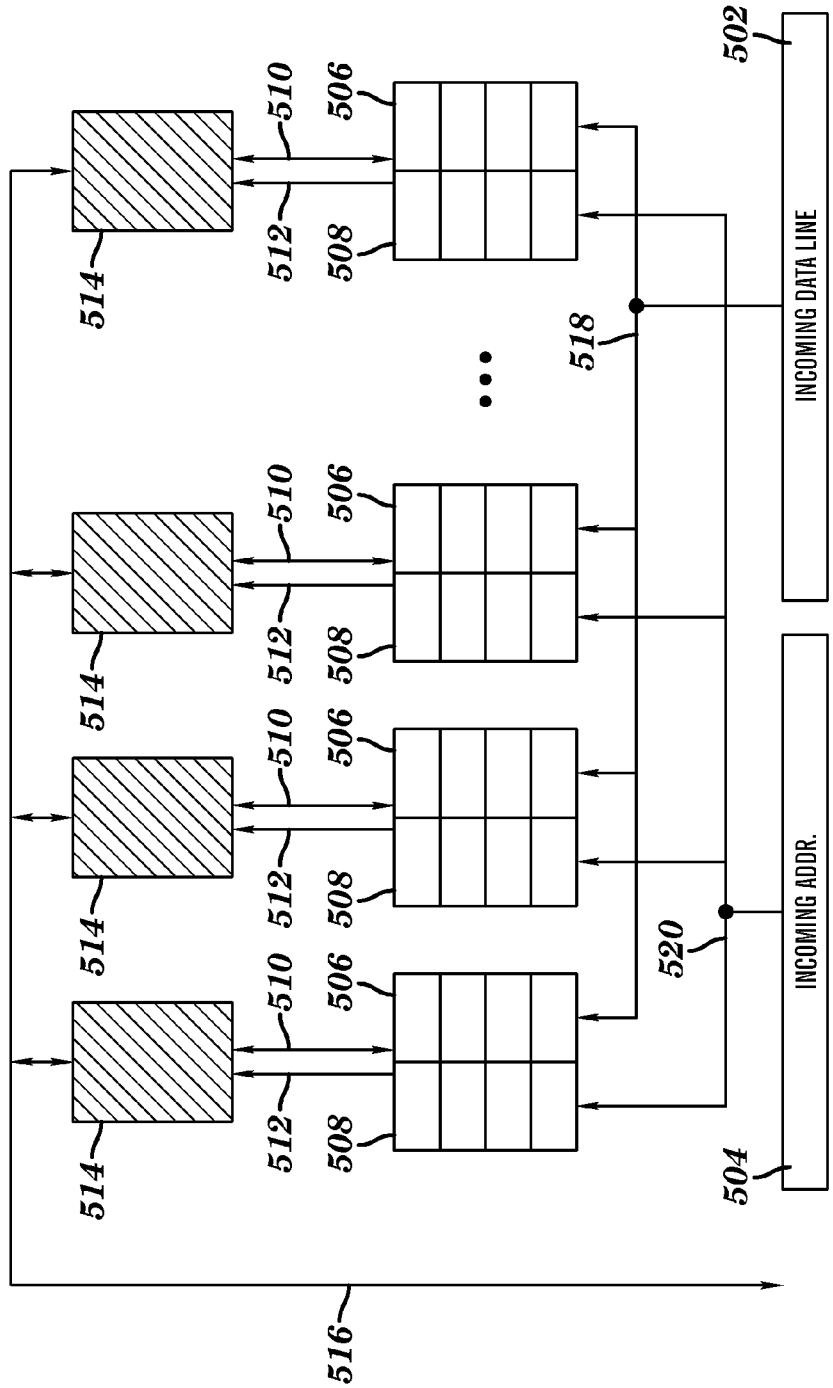
FIG. 5 is a block diagram of a memory system that utilizes a separate data bus and address bus for each memory array in accordance with an embodiment.

FIG. 5 depicts an embodiment of a memory system that utilizes a separate data bus 518 and address bus 520 for each memory array 514. As shown in FIG. 5, an incoming data line 502 and the write address of the incoming data line 502 (the incoming address 504) are received. The incoming data line 502 is split into several data pieces. Each data piece is queued in one of the data buffers 506. The incoming address 504 is replicated and queued in separate address buffers 508, one address buffer 508 for each data piece. Each data buffer 506 is connected to a memory array 514 through a series of dedicated buses: a dedicated data bus 510, and a dedicated address bus 512.

As shown in FIG. 5, each memory array 514 receives an address and a piece of data to be written from its corresponding pair of buffers (address buffer 508 and data buffer 506). Similarly as before, when a write is completed, the memory array 514 signals the completion through a control bus 516 to the memory controller which triggers the deletion of the corresponding entries from the address buffer 508 and the data buffer 506. When each of the address buffers 508 and the data buffers 506 for each of the several data pieces have at least one empty location, then a new incoming data line 502 and new incoming address 504 is accepted into all the address buffers 508 and data buffers 506 buffers for all the several data pieces.

In an embodiment, the memory system depicted in FIG. 5 is located on a single integrated circuit.

Figure 6:
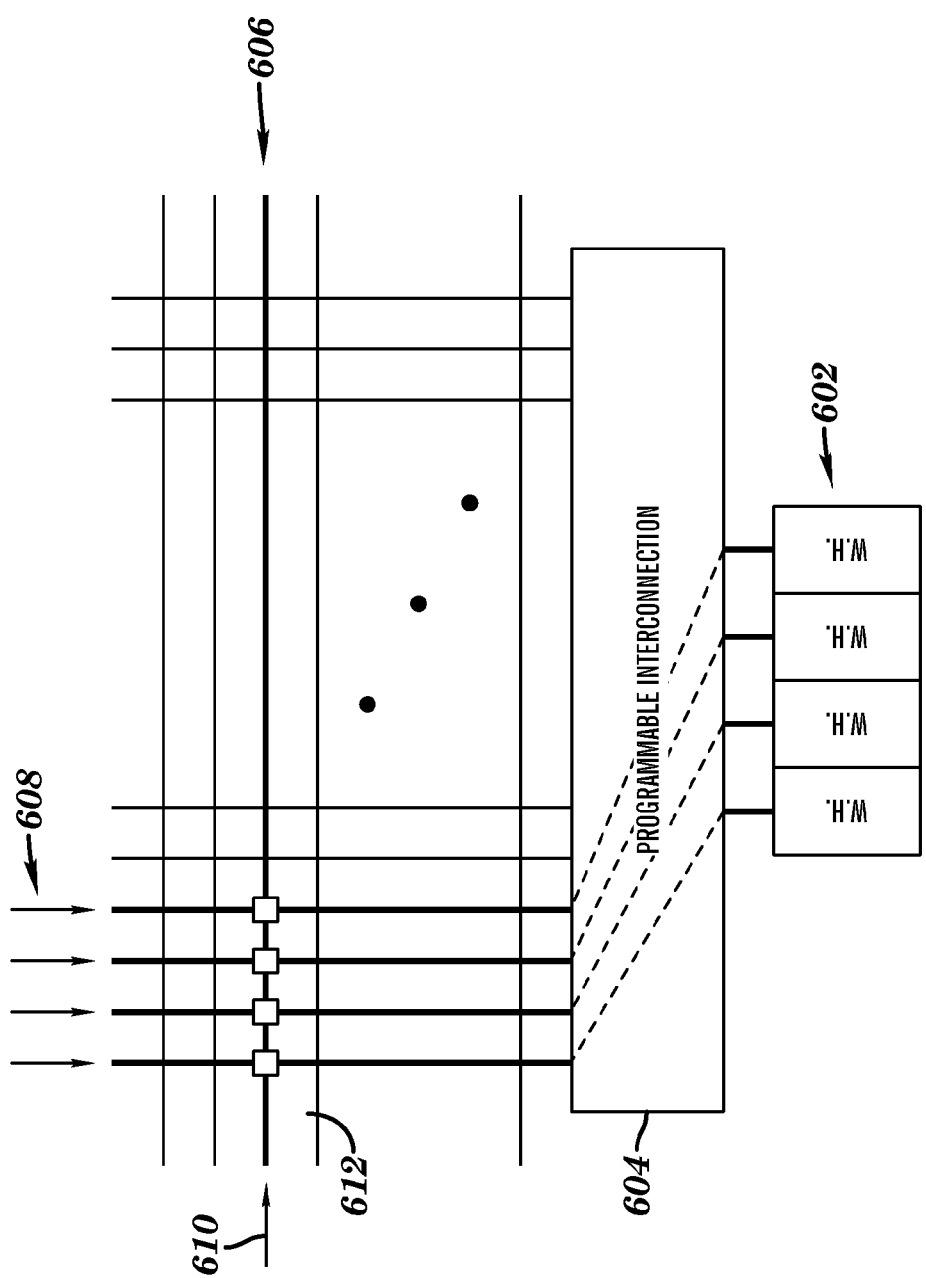
FIG. 6 is a block diagram of a memory array structure in accordance with an embodiment.

FIG. 6 depicts a memory sub-array structure that can be part of a larger memory array in accordance with an embodiment. As shown in FIG. 6, a number of write heads 602, responsible for writing to a memory element (e.g., a group of memory cells), are connected to the bitlines 608 of a memory sub-array 606 by means of a programmable interconnection 604. In preparation for a write, a group of memory cells 612 (e.g., a fraction of a wordline in the memory sub-array) is identified (e.g., via an address). The corresponding bitlines 608 are connected to the write heads 602 by programming the programmable interconnection 604. The wordline 610 corresponding to the group of memory cells 612 is identified and then the write starts (e.g., an iterative write for PCM devices).

In exemplary embodiments, the programmable interconnection enacts an electrical connection and the write heads contain electrical circuits providing the signals for programming the cells. In additional exemplary embodiments, the write heads represent processing resources that are used to perform the computations needed for the iterative programming. In further exemplary embodiments, the circuits responsible for generating the electrical signal necessary to program the memory cells are in a separate peripheral circuitry.

Figure 7:
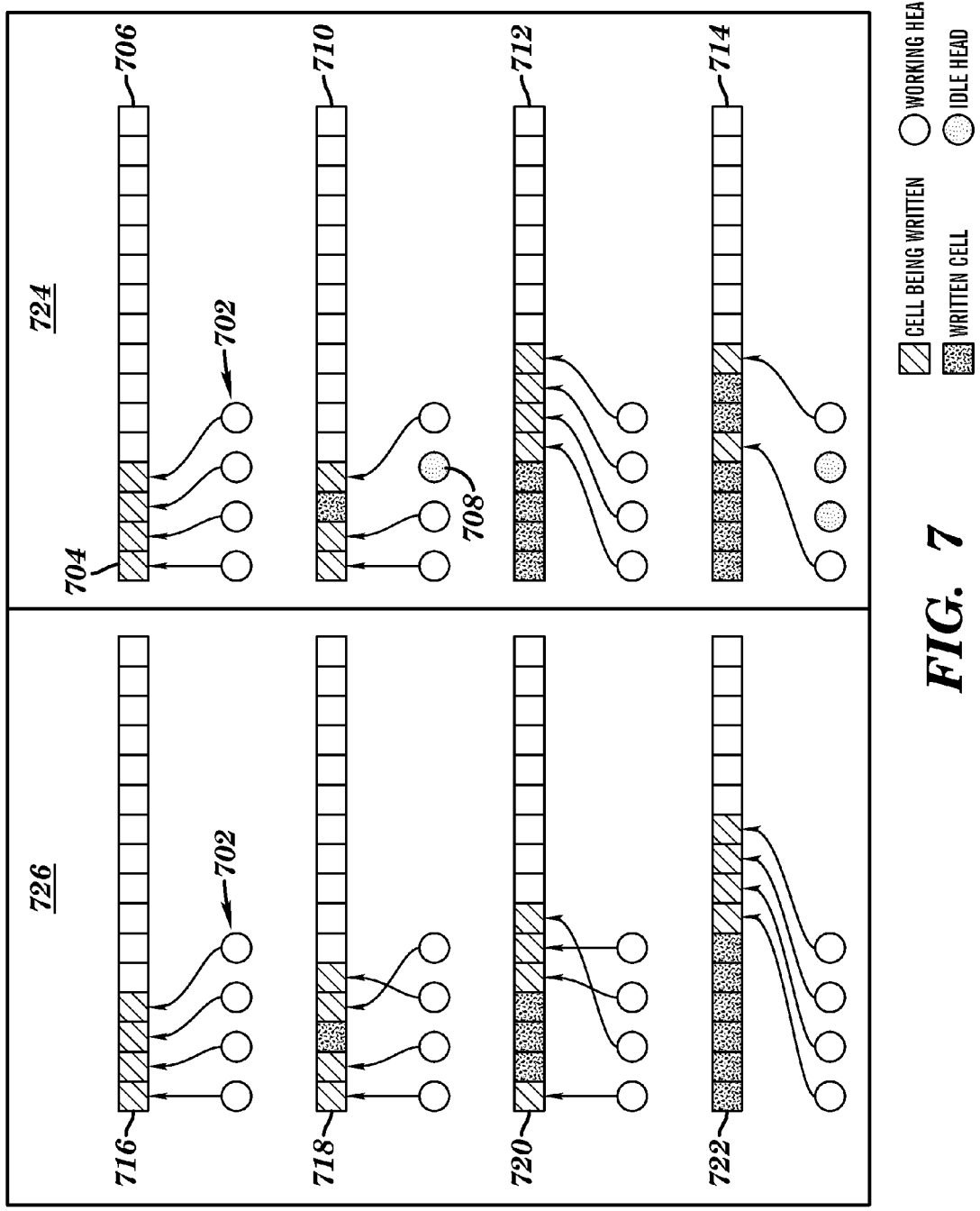
FIG. 7 illustrates two approaches to performing a write to a memory array in accordance with an embodiment.

FIG. 7 depicts two approaches to performing a write to a group of cells in a memory device. In the examples depicted in FIG. 7, there are four write heads for each group of memory cells and each group is made up of sixteen memory cells, thus it requires four cycles to write the portion of the incoming data line to be stored in the array.

The approach in the box 724 on the right requires the four write head to operate as a unit, in that they must wait until all four writes are complete before moving to the next group of four memory cells. Thus, the bandwidth of a write operation is limited by the slowest write in each cycle. The approach in the box 726 on the left removes this limitation and includes full associativity, in that each write head can write to any of the memory cells in the group. In addition the approach in the box 726 on the left allows each write head to operate independently, thus when a write head completes a write, it moves to the next memory cell in the group to be written.

As shown in the first row 706 in box 724, a group of write heads 702 (four in this example) are connected to a first group of cells 704 among the set of cells that are being written (e.g., to an array). A write head among write heads 702 becomes idle whenever it completes a write (e.g. write head 708). The second row 710 in box 724 shows one memory cell where the write is complete and three memory cells where the write is in process. When all the write heads 702 finish their job (e.g., complete a write to a memory cell), they are reconnected to a new group of cells, as shown in the third row 712 in box 724. The fourth row 714 in box 724 shows two memory cells where the write is complete and two memory cells where the write is in process. Thus, the approach to writing shown in box 724, requires all of the write heads 702 in a group to wait (i.e., they are idle) until the memory cell having the longest write latency in the group has completed writing.

In the embodiment depicted in box 726, as soon as a write head completes a write, it is connected to a new memory cell to be programmed. As shown at row 716 in box 726, all four memory cells in the group are being written. At row 718 in box 726, the write to the third memory cell has completed and the write head begins writing to the fifth memory cell in the row. This is contrasted to row 710 in box 724, where the write head that completed the write to the third memory cell is idle, waiting for the other three write heads to complete their writes. At the third row 720 in box 726, the writes to three of the first four memory cells has been completed, and the write heads are writing to the next memory cells. The write to the first memory cell has not been completed, however, the other three memory heads do not have to wait in an idle state for it to complete, as would be the case in box 724. At the fourth row 722 in box 726, the write to the first memory cell has completed and the write head begins a write to the next memory cell in the row. Thus, the write approach depicted in box 726 results in writing data faster than the approach depicted in box 724.

Figure 8:
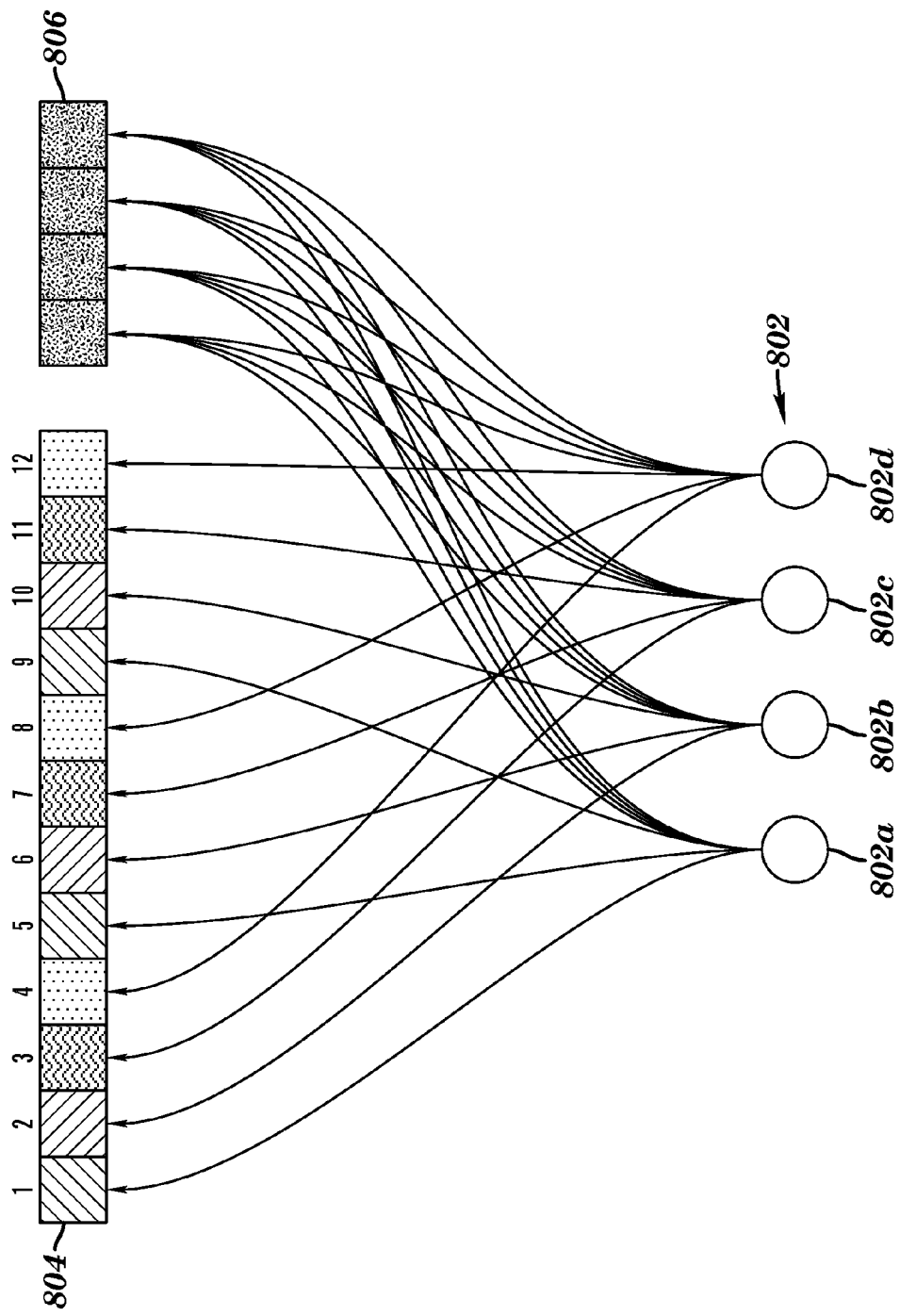
FIG. 8 illustrates an approach to performing a write to a memory array in accordance with an embodiment.

In an embodiment, each write head is connected only to a limited number of bitlines. In an embodiment, a subset of the bitlines have greater connection capability than the other bitlines. This is shown in the embodiment in FIG. 8, where four write heads 802 are connected to a set (or bank) of sixteen memory cells, separated into a first group of memory cells 804 and a second group of memory cells 806. The first write head 802a is connected only to the first, fifth, and ninth memory cells; the second write head 802b is connected only to the second, sixth, and tenth memory cells; the third write head 802c is connected only to the third, seventh, and eleventh memory cells; the fourth write head 802d is connected only to the fourth, eighth, and twelfth memory cells. The second group of memory cells 806 however have greater connectivity, in that every write head 802 can be connected to every one of memory cells in the second group of memory cells 806. The operation of the circuit depicted in FIG. 8, is similar to that of FIG. 7, where once the information regarding the memory cells to be written is received (e.g., data to be written and address), the write heads 802 are connected to the first memory cells (those with low connectivity in FIG. 8). As soon as a write head 802 completes a write to a given memory cell, it is switched to the following memory cell to which it can be connected and which is not being operated by another write head 802. As shown in the arrangement in FIG. 8, the probability of the next memory cell being operated by another memory head can be different from zero only in the second group of memory cells 806 (the last group of memory cells) which allow for greater connectivity.

In an embodiment, a write to a line in a data buffer is considered complete when contents of the line in the data buffer have been written to the memory cells. Embodiments described herein may be utilized to increase the speed of writes within a memory array by allowing write heads to move to write to a next memory cell independently of the other write heads, thus increasing the ratio between busy and idle time for write heads.

In an embodiment, the writing of an incoming data line is considered complete when all pieces of the incoming data line (stored in the memory array dedicated data buffers) have been written to their respective arrays. Embodiments described herein may be utilized to increase the speed of writes within the memory system by allowing a memory array to move to write a piece of a next incoming data line independently of the other memory arrays.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Further, as will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A memory system comprising:
    a plurality of memory arrays comprising a plurality of memory cells, the memory cells characterized by a variable write time;
    a memory bus configured to receive write commands, the write commands comprising write addresses and data lines;
    a plurality of data buffers configured to communicate with the memory arrays, each data buffer associated with one of the memory arrays;
    an address buffer configured to communicate with the memory arrays and to store the write addresses, the address buffer comprising a plurality of dedicated address buffers, each dedicated address buffer associated with one of the memory arrays;
    a mechanism configured to receive a write command comprising a write address and a data line from the memory bus, to split the data line into a number of parts, to store parts of the data line in different data buffers, to store the write address in the address buffer, and to initiate writing the parts of the data line to the memory arrays at the write address; and
    a write completion signal configured to communicate with the memory arrays for receiving write completion signals from the memory arrays, wherein a write completion signal is generated by a memory array in response to the memory array completing a write of a part of the data line to the write address, the write command completed when the write completion signals specifying the write address have been received from all of the memory arrays.

2. The memory system of claim 1, wherein a memory array begins writing a part of a second data line from a second write command before the write completion signals are received from all of the memory arrays.

3. The memory system of claim 1, wherein the dedicated address buffers are located on the memory arrays.

4. The memory system of claim 1, wherein the memory cells are phase change memory cells.

5. The memory system of claim 1, wherein the memory cells are dynamic random access memory (RAM) cells.

6. The memory system of claim 1, wherein the memory cells are resistive RAM cells.

7. A memory device comprising:
    a memory array comprising a plurality of memory cells grouped into memory sub-arrays, the memory cells characterized by a variable write time;
    a plurality of write heads configured to write to the memory cells, the number of write heads less than the number of memory cells in a memory sub-array;
    programmable interconnection circuitry configured to connect the write heads to selected memory cells;
    a mechanism configured to:
        receive a write command, the write command comprising an address identifying a memory sub-array and a data line comprising bits;
        connect the write heads to a subset of the memory cells in the memory sub-array;
        initiate a write by the write heads of a subset of the bits in the data line to the subset of the memory cells in the memory sub-array;
        reconnect a write head to an other memory cell in the memory sub-array in response to the write head completing the write; and
        initiate a write by the write head of a bit in the data line to the other memory cell in response to the reconnecting, the received write command complete when all of the bits in the data line have been written.

8. The memory device of claim 7, wherein the memory sub-array includes bitlines and wordlines, and the selected memory cells belong to the same wordline.

9. The memory device of claim 7, wherein one or more of the memory cells are configured to connect to at least two of the write heads.

10. The memory device of claim 7, wherein each of the memory cells is configured to connect to a selected write head.

11. The memory device of claim 7, wherein each of the memory cells is configured to connect to all of the write heads.

12. The memory device of claim 7, wherein the memory device is a phase change memory.

13. The memory device of claim 7, wherein the memory device is one of a dynamic random access memory (RAM) and a resistive RAM.

14. The memory device of claim 7, wherein the mechanism is further configured to send a completion signal in response to the received write command being complete and for receiving a second write command in response to sending the completion signal.

15. The memory device of claim 7, wherein the memory device further comprises an address buffer for storing the address.

16. A computer implemented method for writing to memory, the method comprising:
- receiving a write command, the write command comprising an address identifying a memory sub-array and a data line comprising bits, the write command received at a memory device comprising a memory array, the memory array comprising a plurality of memory cells grouped into memory sub-arrays, the memory cells characterized by a variable write time, the memory device further comprising a plurality of write heads for writing to the memory cells, the number of write heads less than the number of memory cells in a memory sub-array;
- connecting the write heads to a subset of the memory cells in the memory sub-array;
- initiating a write by the write heads of a subset of the bits in the data line to the subset of the memory cells in the memory sub-array;
- reconnecting a write head to an other memory cell in the memory sub-array in response to the write head completing the write; and
- initiating a write by the write head of a bit in the data line to the other memory cell in response to the reconnecting, the received write command complete when all of the bits in the data line have been written.

17. The method of claim 16, wherein the memory sub-array includes bitlines and wordlines, and the selected memory cells belong to the same wordline.

18. The method of claim 16, wherein one or more of the memory cells are configured to connect to at least two of the write heads.

19. The method of claim 16, further comprising sending a completion signal in response to the received write command being complete, and receiving a second write command in response to sending the completion signal.

20. The method of claim 16, wherein each of the memory cells is configured to connect to a selected write head.

21. The method of claim 16, wherein each of the memory cells is configured to connect to all of the write heads.

22. The method of claim 16, wherein the memory device is a phase change memory.

23. The method of claim 16, wherein the memory device is one of a dynamic random access memory (RAM) and a resistive RAM.

24. The method of claim 16, wherein the memory device further comprises an address buffer for storing the address.

* * * * *